United States Patent
Srinivasan et al.

(10) Patent No.: US 10,747,282 B2
(45) Date of Patent: Aug. 18, 2020

(54) TEST CIRCUIT FOR ELECTRONIC DEVICE PERMITTING INTERFACE CONTROL BETWEEN TWO SUPPLY STACKS IN A PRODUCTION TEST OF THE ELECTRONIC DEVICE

(71) Applicant: STMicroelectronics International N.V., Schiphol (NL)

(72) Inventors: Venkata Narayanan Srinivasan, Greater Noida (IN); Srinivas Dhulipalla, Prakasam (IN); Sandip Atal, Greater Noida (IN)

(73) Assignee: STMicroelectronics International N.V., Schiphol (NL)

( * ) Notice: Subject to any disclaimer, the term of this patent is extended or adjusted under 35 U.S.C. 154(b) by 104 days.

(21) Appl. No.: 16/162,543

(22) Filed: Oct. 17, 2018

(65) Prior Publication Data
US 2020/0125149 A1 Apr. 23, 2020

(51) Int. Cl.
| | |
|---|---|
| G06F 1/24 | (2006.01) |
| H03K 19/00 | (2006.01) |
| G01R 31/319 | (2006.01) |
| G06F 1/3206 | (2019.01) |
| H03K 17/22 | (2006.01) |

(52) U.S. Cl.
CPC ......... *G06F 1/24* (2013.01); *G01R 31/31905* (2013.01); *G01R 31/31924* (2013.01); *G06F 1/3206* (2013.01); *H03K 17/223* (2013.01); *H03K 19/0016* (2013.01)

(58) Field of Classification Search
CPC ..... G06F 1/24; G06F 1/3206; G01R 31/1905; G01R 31/31924; H03K 17/223; H03K 19/0016

USPC .................................................. 713/1
See application file for complete search history.

(56) References Cited

U.S. PATENT DOCUMENTS

| | | | | |
|---|---|---|---|---|
| 4,951,171 A | * | 8/1990 | Tran | G06F 1/30 340/660 |
| 5,224,010 A | * | 6/1993 | Tran | G06F 1/28 361/90 |
| 6,204,706 B1 | * | 3/2001 | Horvath | G06F 1/28 327/143 |
| 7,420,791 B1 | * | 9/2008 | Dong | G01R 31/31721 361/90 |
| 9,471,120 B1 | | 10/2016 | Thakur et al. | |
| 9,698,771 B1 | | 7/2017 | Srinivasan et al. | |

(Continued)

*Primary Examiner* — Paul R. Myers
(74) *Attorney, Agent, or Firm* — Crowe & Dunlevy

(57) ABSTRACT

An electronic device includes a power management circuit generating output for a plurality of voltage monitors that each detect whether voltages received from a test apparatus are at least a different minimum threshold. The power management circuit also generates a test enable signal indicative of whether the test apparatus is supplying the minimum required voltages to the electronic device. A control circuit receives the output for the plurality of voltage monitors and the test enable signal and generates at least one control signal as a function of the output for the plurality of voltage monitors and the test enable signal. An output circuit receives the at least one control signal and generates an interface control signal that selectively enables or disables interface with analog intellectual property packages within the electronic device, in response to the at least one control signal.

21 Claims, 6 Drawing Sheets

(56) References Cited

U.S. PATENT DOCUMENTS

| | | |
|---|---|---|
| 2003/0062552 A1 | 4/2003 | Takata |
| 2008/0126814 A1* | 5/2008 | Burkland ............ G06F 13/4081 713/300 |
| 2010/0315151 A1 | 12/2010 | Burdett |
| 2012/0126632 A1* | 5/2012 | Ji ............................ G06F 1/263 307/115 |
| 2016/0118884 A1 | 4/2016 | Fernald |

* cited by examiner

TEST CIRCUIT FOR ELECTRONIC DEVICE PERMITTING INTERFACE CONTROL BETWEEN TWO SUPPLY STACKS IN A PRODUCTION TEST OF THE ELECTRONIC DEVICE

TECHNICAL FIELD

This disclosure is related to the field of test circuits integrated within devices that enable easier and less expensive testing of those devices.

BACKGROUND

After integrated circuits are produced, it is desirable to be able to test those integrated circuits for proper function so that malfunctioning integrated circuits can be removed and production yield can be determined. This is typically performed using a test apparatus that connects to pins or pads of the integrated circuit, provides power to the integrated circuit, and causes entry of the integrated circuit into a desired one of its test modes.

While this approach is suitable in some circumstances, issues may arise. For example, out of a desire to utilize a single voltage stack for test mode entry and during test modes, all voltage monitors except those for a minimum voltage for test detection and power on reset are masked, which may allow proper operation during test modes, but during test mode entry, analog intellectual property packages (IPs) within the integrated circuit may be operated outside of their rated operating voltages which may result in failure to enter test mode, ultimately resulting in yield loss. As another example, yielding to a desire to reduce the number of pins or pads used by the integrated circuit for testing and to reduce the number probes used by the tester to electrically connect to those pins or pads may result in excess power consumption and potential shortening of the life of the integrated circuit. Another result of prior art setups may result in repeated reset if any voltage drop occurs when supply voltage is ramping up during boot, which may in turn cause a delay in the start of applications when the device is used in customer or end user environment (e.g. a device fitted in a car).

Existing designs that aim to eliminate this issue are "workarounds" at best and create unnecessary device constraints, such as a delay in bootup time, consumption of additional area on the integrated circuit, excess power consumption, and the addition of an extra pin or pad and probe and resulting cost increases. Therefore, further development into this area is needed.

SUMMARY

Disclosed herein is an electronic device for use with a test apparatus. The electronic device includes a power management circuit configured to generate output for a plurality of voltage monitors that each detect whether voltages received from the test apparatus are at least a different minimum threshold. The power management circuit is also configured to generate a test enable signal indicative of whether the test apparatus is supplying the voltages to the electronic device. A control circuit receives the output for the plurality of voltage monitors and the test enable signal, and is configured to generate at least one control signal as a function of the output for the plurality of voltage monitors and the test enable signal. An output circuit receives the at least one control signal and is configured to generate an interface control signal that selectively enables or disables interface with analog intellectual properties (IPs) within the electronic device, in response to the at least one control signal. The voltages received from the test apparatus are an upper voltage and a lower voltage, and each of the plurality of voltage monitors receives input from either the upper voltage or the lower voltage and indicates whether the received upper voltage or received lower voltage is at least a different given threshold.

The at least one control signal may be a set signal and a reset signal, and the output circuit may be a latch having a set input receiving the set signal and a reset input receiving the reset signal.

The control circuit may include a first AND gate receiving the output for each of the plurality of voltage monitors and configured to assert the set signal if each of the plurality of voltage monitors indicates that its received upper voltage or received lower voltage is at least its different given threshold. The control circuit may also include a logic circuit receiving the set signal and configured to assert the reset signal as a function of the set signal and the test enable signal.

The power management circuit may also be configured to generate a monitor mask signal that when asserted indicates whether the set signal is to be masked, and the logic circuit may assert the reset signal as a function of the set signal, the test enable signal, and the monitor mask signal.

The logic circuit may include an OR gate receiving the set signal and the monitor mask signal, and a second AND gate receiving output from the OR gate and the test enable signal, the second AND gate being configured to generate the reset signal as a function of the output from the OR gate and the test enable signal.

The test enable signal may include a power on reset signal and a minimum voltage detector for a testing signal.

Also disclosed herein is an electronic device for use with a test apparatus. The electronic device includes a power management circuit configured to generate output for a plurality of voltage monitors that determine a range for first and second supply voltages received by the electronic device from the test apparatus. A control circuit receives the output for the plurality of voltage monitors and is configured to generate at least one control signal as a function of the output for the plurality of voltage monitors. An output circuit receives the at least one control signal and is configured to generate an interface control signal that selectively enables or disables interface with analog intellectual properties (IPs) within the electronic device in response to the at least one control signal.

The interface control signal may enable interface of all analog IPs within the electronic device as a function of the at least one control signal indicating that all analog IPs are currently coupled to the first and second supply voltages, and the interface control signal may disable or enable interface of ones of the analog IPs based on whether they are currently coupled to the first and second supply voltages.

The first and second supply voltages may be selectively coupled to a first voltage stack for test mode entry, nonvolatile memory testing and testing of analog IPs, and to a second voltage stack for digital test mode.

An upper end of the first voltage stack may be less than an upper end of the second voltage stack, and a lower end of the first voltage stack may be higher than a lower end of the second voltage stack.

Each of the plurality of voltage monitors may receive input from either the first supply voltage or the second supply voltage and indicate whether the received first supply voltage or received second voltage is at least a different given threshold.

The at least one control signal may be a set signal and a reset signal, and the output circuit may include a latch having a set input receiving the set signal and a reset input receiving the reset signal.

The power management circuit may also be configured to generate a test enable signal indicative of whether the test apparatus is supplying the minimum required first and second supply voltages to the electronic device. The control circuit may include a first AND gate receiving the output for each of the plurality of voltage monitors and configured to assert the set signal if each of the plurality of voltage monitors indicates that its received first supply voltage or received second supply voltage is at least its different given threshold. A logic circuit may receive the set signal and may be configured to assert the reset signal as a function of the set signal and the test enable signal.

The power management circuit may also be configured to generate a monitor mask signal that when asserted indicates whether the set signal is to be masked, and the logic circuit may assert the reset signal as a function of the set signal, the test enable signal, and the monitor mask signal.

The logic circuit may include an OR gate receiving the set signal and the monitor mask signal, and a second AND gate receiving output from the OR gate and the test enable signal, the second AND gate being configured to generate the reset signal as a function of the output from the OR gate and the test enable signal.

Also disclosed herein is an electronic device for use with a test apparatus that is switchable between first and second power supply stacks. The electronic device includes a power management circuit configured to generate output for the first and second power supply stacks based on the first and second power supply stacks being applied to the electronic device from the test apparatus. The power management circuit is also configured to generate a test enable signal indicative of whether at least one of the first and second power supply stacks is coupled to the electronic device from test apparatus. A control circuit receives the output for the first and second power supply stacks and the test enable signal and is configured to generate at least one control signal as a function of the output for the first and second power supply stacks and the test enable signal. An output circuit receives the at least one control signal and is configured to generate an interface control signal that selectively enables or disables interface with analog intellectual properties (IPs) within the electronic device, in response to the at least one control signal.

The at least one control signal may be a set signal and a reset signal, and the output circuit may be a latch having a set input receiving the set signal and a reset input receiving the reset signal.

The power management circuit may also be configured to generate a monitor mask signal that is asserted when the second power supply stack applied from test apparatus and indicates masking of the set signal.

The control circuit may include a first AND gate receiving the output for the first and second power supply stacks and configured to assert the set signal if the first power supply stack is connected to the electronic device. An OR gate may receive the set signal and the monitor mask signal, and a second AND gate may receive output from the OR gate and the test enable signal and may be configured to deassert the reset signal if one of the first and second power supply stack is coupled to the electronic device and assert the reset signal if one of the first and second power supply stack is not connected to the electronic device.

The test enable signal may be a power on reset signal and a minimum voltage detector for a test signal corresponding to both a low voltage supply and a high voltage supply.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
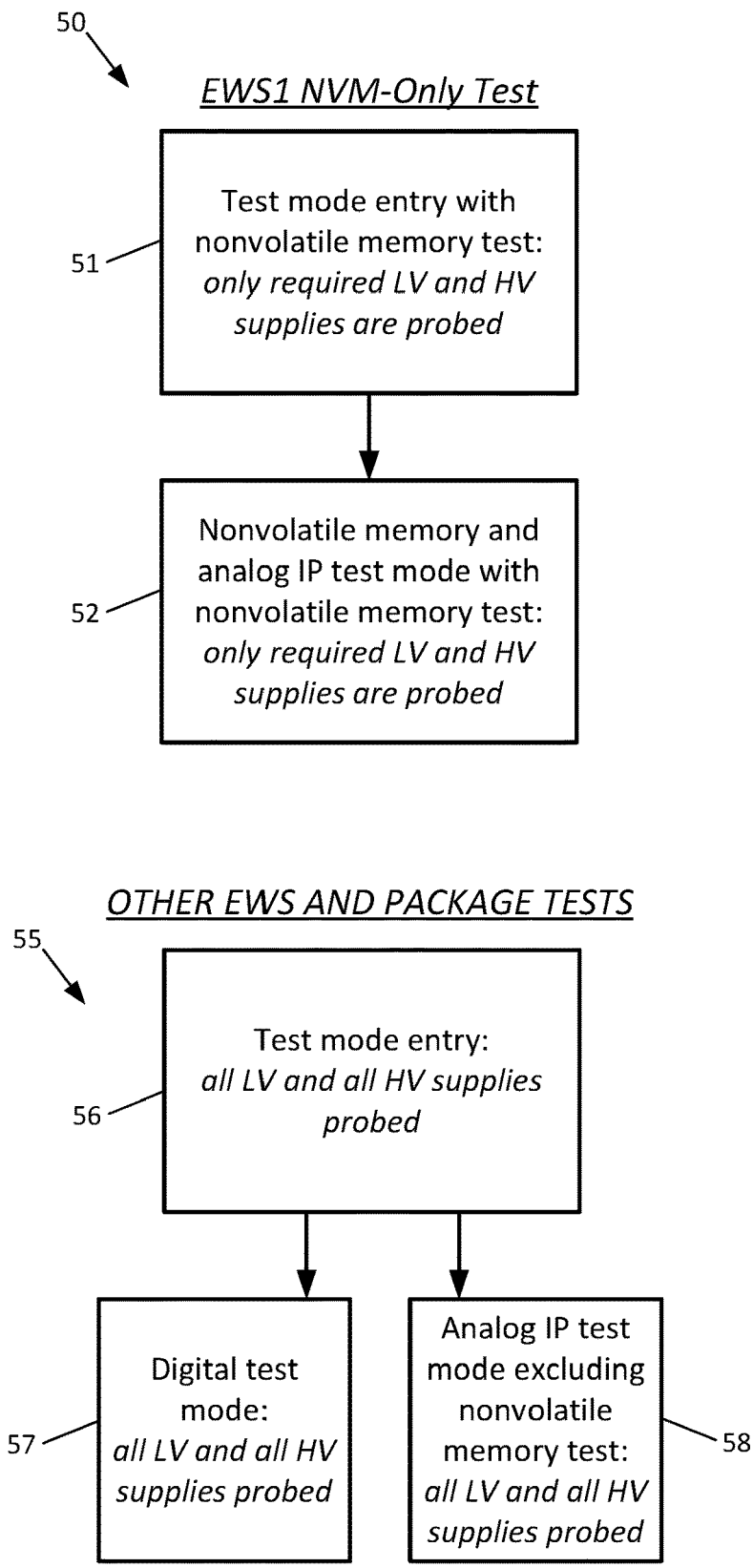
FIG. 1 is a flow chart of a test flow disclosed herein for an electronic device.
Figure 2:
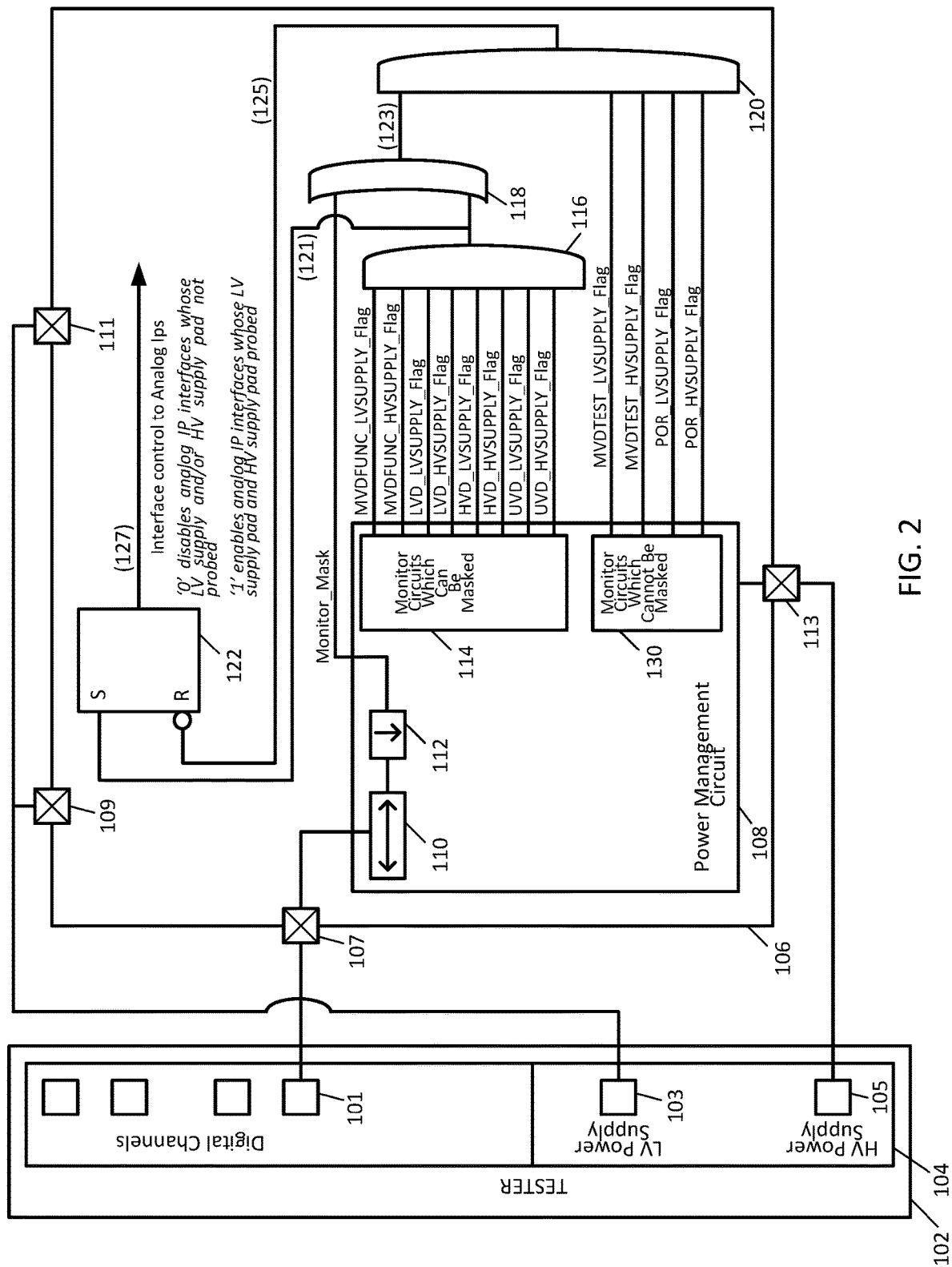
FIG. 2 is a schematic circuit diagram of an electronic device for use with a test apparatus.

Now described with reference to FIGS. 1-2 is a basic test flow (shown in FIG. 1) performed on an electronic device 106 (shown in FIG. 2) using a test apparatus 102 (also shown in FIG. 2). The electronic device 106 may be an integrated circuit chip and has externally accessible pads (or, in some cases, pins) 107, 109, 111, 113 that are accessible to probes connected to the test apparatus 102. The electronic device 106 receives output from a high voltage (HV) power supply voltage output 105 via pad 113 and output from a low voltage (LV) power supply voltage output 103 via pads 109 and 111. The electronic device 106 includes analog IPs (not shown) and nonvolatile memory (not shown).

The test flow is shown in FIG. 1. Show in the flowchart 50 is the flow of a first electronic wafer sort test that targets only the nonvolatile memory within the electronic device 106. This test can be referred to as an "EWS1 NVM-Only Test". For this test, at step 51, only the required LV and HV power supplies are probed and other power supplies are not probed. This is done so as to save cost. Test mode entry is followed by, at step 52, the nonvolatile memory and analog IP test mode in which the nonvolatile memory is tested, keeping in mind that only the required LV and HV power supplies are probed.

Shown in the flowchart 55 is the flow for other electronic wafer testing steps as well as all package test steps, referred to as "Other EWS and Package Tests". Since these testing steps target the entire electronic device 106, all LV and HV power supplies are probed at test mode entry, at step 56. Test mode entry is followed by, at step 57, digital IP test modes, and/or, at step 58, analog IP test modes that exclude the nonvolatile memory test. Both the digital IP test mode and analog IP test modes that exclude the nonvolatile memory test are performed with all LV and HV supplies probed.

Now further described with additional reference to FIG. 2 is the electronic device 106 for use with the test apparatus 102. The test apparatus 102 may be a test device or test fixture, and includes digital channel outputs, such as the digital channel output 101 shown, as well as the LV and HV supply voltage outputs 103, 105.

The electronic device 106 may be an integrated circuit chip, such as a system on a chip (SOC) or application specific integrated circuit (ASIC), and has externally accessible pads (or, in some cases, pins) 107, 109, 111, 113 that are accessible to probes connected to the test apparatus 102. The electronic device 106 includes a power management circuit 108 receiving output from the HV power supply voltage output 105 via pad 113. The power management circuit 108 includes mask determination circuits 110, 112 that determine whether the output of monitor circuits 114 should be masked, and output a Monitor_Mask signal indicating whether the output of the monitor circuits 114 are to be masked. The monitor circuits 114 determine the range for both the HV power supply voltage output 105 and the LV power supply voltage output 103.

Figure 3:
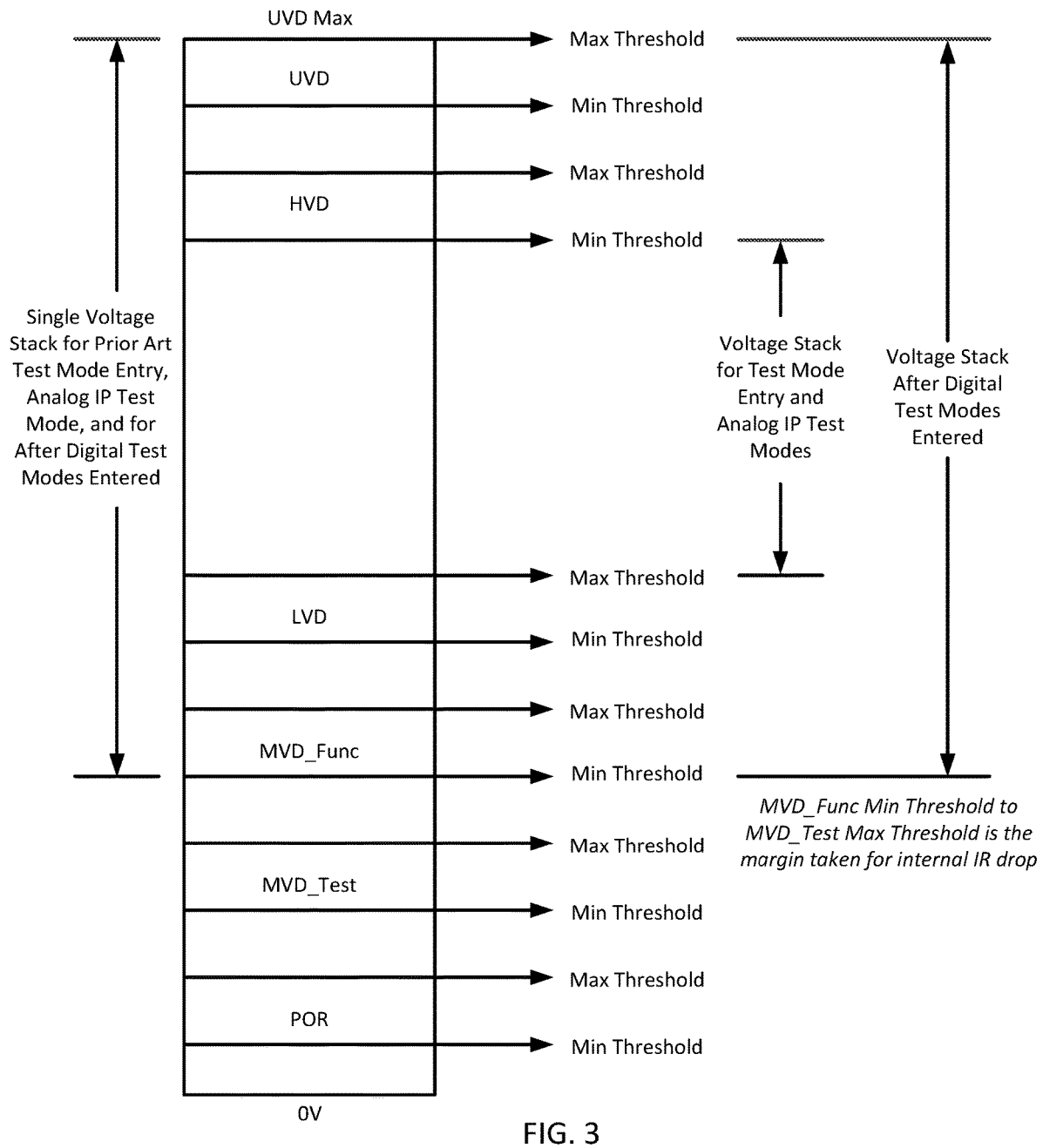
FIG. 3 is a diagram showing different voltage stacks that may be used with the electronic device for test mode entry, analog testing mode, and for digital testing mode.

For better understanding of the potential voltage ranges for the HV power supply voltage output 105 and the LV power supply voltage output 103, additional reference is now made to FIG. 3 As illustrated in FIG. 3 the minimum and maximum range of voltages for the LV power supply voltage output 103 and HV power supply voltage output 105 are to be at ground (0 V) and the ultra-high voltage detector maximum threshold respectively. However, this maximum and minimum range is not used. Instead, in a test mode entry condition, the HV power supply voltage output 105 and LV power supply voltage output 103 is set between the high voltage detector minimum threshold, shown as HVD min threshold, and the low voltage detector maximum threshold, shown as LVD max threshold; in a digital testing mode condition (which occurs once test mode has been successfully entered), the HV power supply voltage output 105 and LV power supply voltage output 103 is set between the ultra high voltage detector maximum threshold, shown as UVD max threshold and minimum voltage detector for functional minimum threshold, shown as MVD FUNC min threshold. This range between the HVD min threshold and LVD max threshold for HV power supply voltage output 105 and LV supply voltage output 103 can be referred to as a voltage stack for test mode entry and ranges between the UVD max threshold and MVD FUNC min threshold for HV power supply voltage output 105 and LV supply voltage output 103. This voltage stack can also be referred to as a voltage stack for digital test modes. Analog test modes are performed using the same voltage stack as test mode entry, i.e. HV power supply voltage output 105 and LV supply voltage output 103 are between HVD min threshold and LVD max threshold. Devices internal to the electronic device 106 are powered according to the voltage stack chosen that take the ultra-high voltage, high voltage, low voltage, etc.

Figure 4:
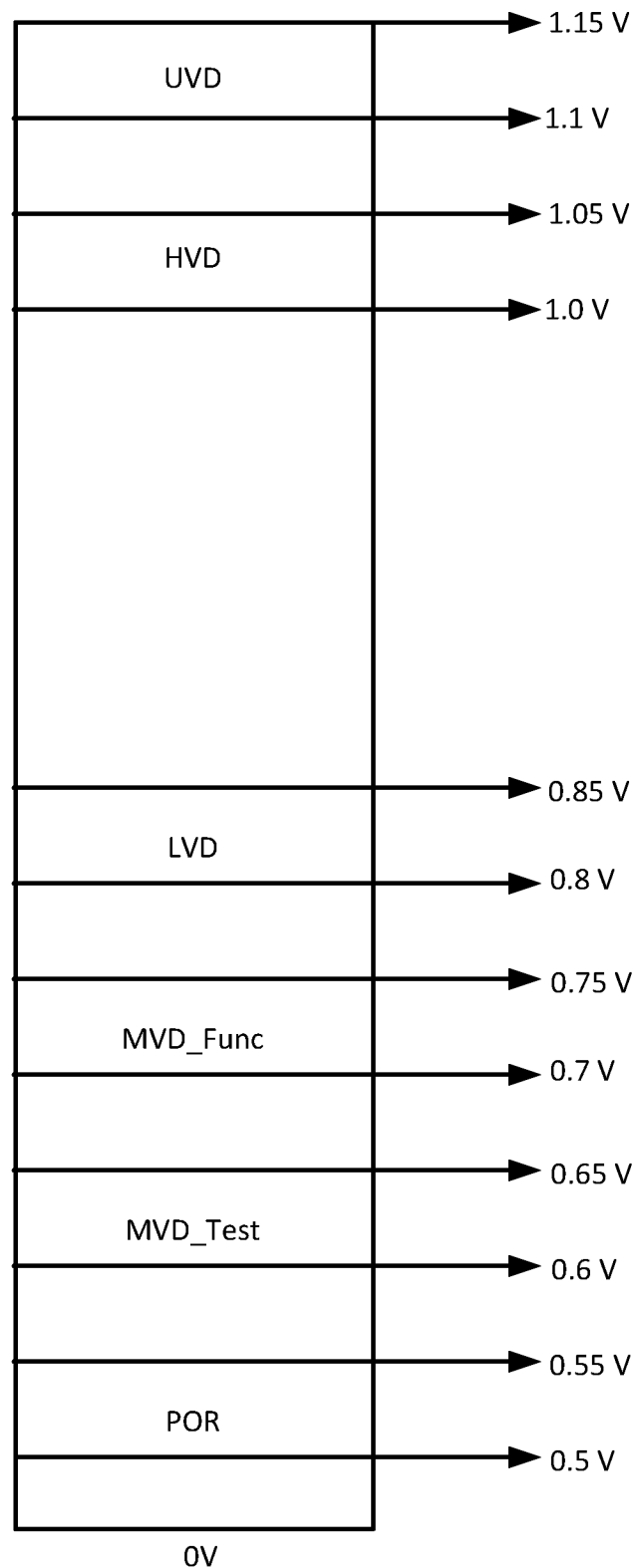
FIG. 4 is a diagram showing an example of monitor thresholds for a low voltage supply.

For better understanding of the minimum and maximum threshold values of voltage detectors or monitors monitoring LV power supply voltage output 103, additional reference is now made to FIG. 4. As illustrated in FIG. 4, the LV power supply voltage output 103 has its own POR, MVD_TEST, MVD_FUNC, LVD, HVD, and UVD thresholds. For example, ranges for the LV power supply are as follows: POR min threshold=0.5v, POR max threshold=0.55v, MVD_Test min threshold=0.6v, MVD_Test max threshold=0.65v, MVD_Func min threshold=0.7v, MVD_Func max threshold=0.75v, LVD_min threshold =0.8v, LVD_max threshold=0.85v, HVD_min threshold=1.0v, HVD_max threshold=1.05v, UVD_min threshold=1.1v, and UVD_max threshold=1.15v.

Figure 5:
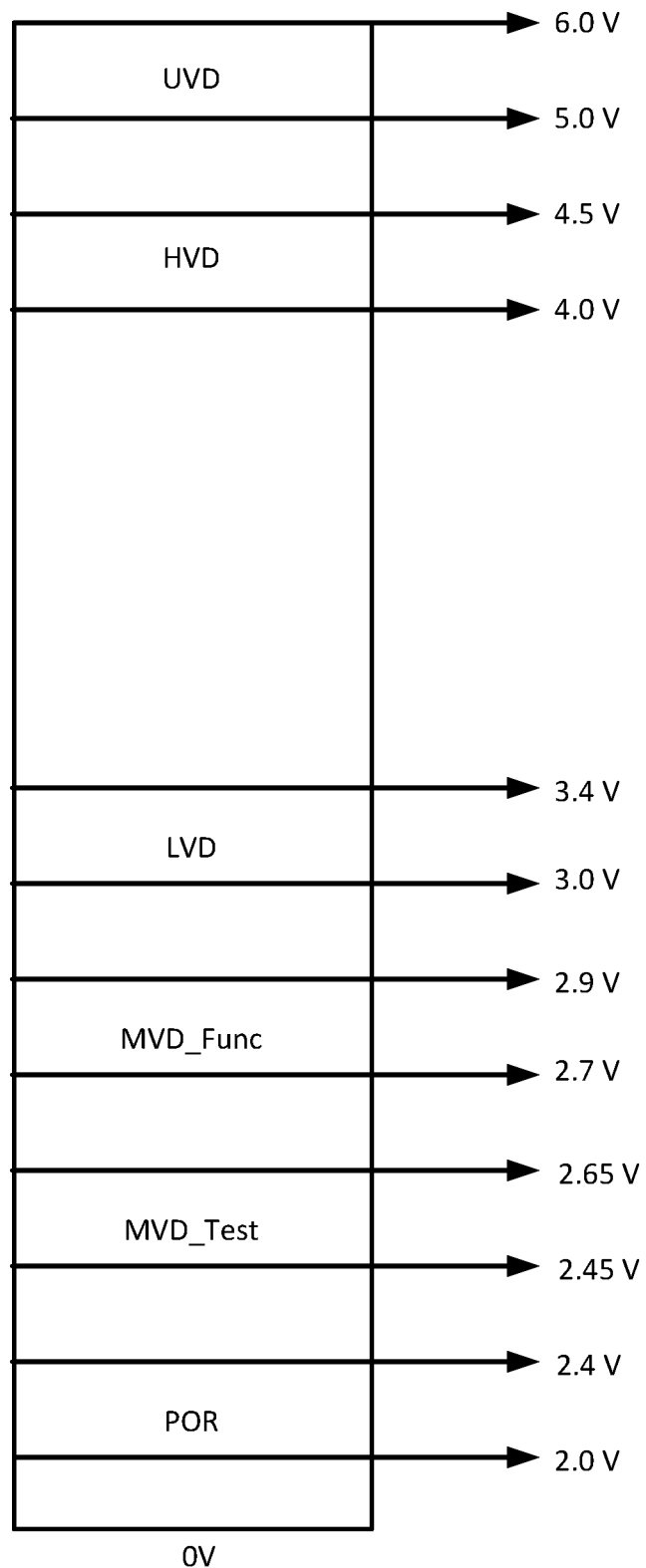
FIG. 5 is a diagram showing an example of monitor thresholds for a high voltage supply.

For better understanding of the minimum and maximum threshold values of voltage detectors or monitors monitoring HV power supply voltage output 105, additional reference is now made to FIG. 5. As illustrated in FIG. 5, the HV power supply voltage output 105 has its own POR, MVD_TEST, MVD_FUNC, LVD, HVD, and UVD thresholds. For example ranges for the HV power supply are as follows: POR min threshold=2.0v, POR max threshold=2.4v, MVD_Test min threshold=2.45v, MVD_Test max threshold=2.65v, MVD_Func min threshold=2.7v, MVD_Func max threshold=2.9v, LVD_min threshold=3.0v, LVD_max threshold=3.4v, HVD_min threshold=4.0v, HVD_max threshold=4.5v, UVD_min threshold=5.0v, and UVD_max threshold=6.0v.

Referring back to FIG. 2, the maskable monitor circuits 114 within the power management circuits 108 serve to generate the MVDFUNC_LVSUPPLY_Flag, MVDFUNC_HVSUPPLY_Flag, LVD_LVSUPPLY_Flag, LVD_HVSUPPLY_Flag, HVD_LVSUPPLY_Flag, HVD_HVSUPPLY_Flag, UVD_LVSUPPLY_Flag and UVD_HVSUPPLY_Flag.

AND gate 116 receives, from the monitor circuits 114, the MVDFUNC_lvsupply_Flag, MVDFUNC_hvsupply_Flag, LVD_LVSUPPLY_Flag, LVD_HVSUPPLY_Flag, HVD_LVSUPPLY_Flag, HVD_HVSUPPLY_Flag, UVD_LVSUPPLY_Flag and UVD_HVSUPPLY_Flag, and performs a logical AND operation on these signals, and provides its output as set signal 121.

OR gate 118 receives the Monitor_Mask signal from the mask determination circuit 112 as well as the set signal 121, performs a logical OR operation on these signals, and provides its output as signal 123.

AND gate 120 receives the signal 123 from the OR gate 118, as well as the MVDTEST_LVSUPPLY_Flag, MVDTEST_HVSUPPLY_Flag, POR_LVSUPPLY_Flag and POR_HVSUPPLY_Flag from the non-maskable monitor circuits 130, performs a logical AND operation on those signals, and provides its output as the reset signal 125.

SR latch 122 receives the set signal 121 at its set input and the reset signal 125 at its reset input. Note the bubble on the reset input of the SR latch 122 indicating inversion of the reset signal 125.

In particular, the monitor circuits 114 generate the MVDFUNC_LVSUPPLY_Flag and LVD_LVSUPPLY_Flag as a logic low when the LV power supply voltage output 103 is below their respective min thresholds. Therefore, where the LV power supply voltage output 103 is below the MVD_FUNC min threshold, the MVDFUNC_LVSUPPLY_Flag is low, and transitions high when the LV power supply voltage output 103 is somewhere between the MVD_FUNC min threshold and MVD_FUNC max threshold. Likewise, where the LV power supply voltage output 103 is below the LVD min threshold, the LVD_LVSUPPLY_Flag is low, and transitions high when the LV power supply voltage output 103 is somewhere between the LVD min threshold and LVD max threshold.

The monitor circuits 114 generate the MVDFUNC_HVSUPPLY_Flag and LVD_HVSUPPLY_Flag corresponding to the HV power supply voltage output 105 as a logic low when the HV power supply voltage output 105 is below their respective min thresholds. Therefore, where the HV power supply voltage output 105 is below the MVD_FUNC min threshold, the MVDFUNC_HVSUPPLY_Flag is low, and transitions high when the HV power supply voltage output 105 is somewhere between the MVD_FUNC min threshold and the MVD_FUNC max threshold. Likewise, where the HV power supply voltage output 105 is below the LVD min threshold, the LVD_HVSUPPLY_Flag is low, and transitions high when the HV power supply voltage output 105 is somewhere between LVD min threshold and LVD max threshold.

The monitor circuits 114 generate the HVD_HVSUPPLY_Flag and UVD_HVSUPPLY_Flag as a logic high where the HV power supply voltage output 105 is below their respective min thresholds. Therefore, where the HV power supply voltage output 105 is below the HVD min threshold, the HVD_HVSUPPLY_Flag is high, and transitions low when the HV power supply voltage output 105 is somewhere between the HVD min threshold and HVD max threshold. Likewise, where the HV power supply voltage output 105 is below the UVD min threshold, the UVD_HVSUPPLY_Flag is high, and transitions low when the HV power supply voltage output 105 is somewhere between UVD min threshold and UVD max threshold.

The monitor circuits 114 generate the HVD_LVSUPPLY_Flag and UVD_SUPPLY_Flag corresponding to the LV power supply voltage output 103 as a logic high where the LV power supply voltage output 103 is below their respective min thresholds. Therefore, where the LV power supply voltage output 103 is below the HVD min threshold, the HVD_LVSUPPLY Flag is high, and transitions low when the LV power supply voltage output 103 is somewhere between HVD min threshold and HVD max threshold. Likewise, where the LV power supply voltage output 103 is below the UVD min threshold, the UVD_LVSUPPLY_Flag is high, and transitions low when the LV power supply voltage output 103 is somewhere between UVD min threshold and UVD max threshold.

The unmasked monitor circuits 130 within the power management circuit 108 output the MVDTEST_LVSUPPLY_Flag at a logic low where the LV power supply voltage output 103 is below the MVD_Test min threshold, and transitions high when the LV power supply voltage output is somewhere between the MVD_Test min threshold and MVD_Test max threshold.

The unmasked monitor circuits 130 within the power management circuit 108 outputs the MVDTEST_HVSUPPLY_Flag at a logic low where the HV power supply voltage output 105 is below the MVD_Test min threshold, and transitions high when the HV power supply voltage output is somewhere between the MVD_Test min threshold and MVD_Test max threshold.

The power management circuit 108 outputs the POR_LVSUPPLY_Flag signal corresponding to the LV supply as a logic low to indicate when a power on reset of the LV supply is being performed, and as a logic high at other times.

The power management circuit 108 outputs the POR_HVSUPPLY_Flag signal corresponding to HV supply as a logic low to indicate when a power on reset of HV supply is being performed, and as a logic high at other times.

Recall that in the test mode entry condition, the LV power supply voltage output 103 and HV power supply voltage output 105 are set between the low voltage detector maximum threshold, shown as LVD max threshold, and the high voltage detector minimum threshold, shown as HVD min threshold, as shown FIG. 3. Therefore, in the test mode entry condition where all the LV supplies and HV supplies are probed, the MVDTEST_LVSUPPLY_Flag, MVDTEST_HVSUPPLY_Flag, MVDFUNC_LVSUPPLY_Flag, MVDFUNC_HVSUPPLY_Flag, LVD_LVSUPPLY_Flag and LVD_HVSUPPLY_Flag will be at a logic high because both the LV power supply voltage output 103 and HV power supply voltage output 105 are greater than the LVD max threshold, and the HVD_LVSUPPLY_Flag, HVD_HVSUPPLY_Flag, UVD_LVSUPPLY_Flag and UVD_HVSUPPLY_Flag will be at a logic high because both the LV power supply voltage output 103 and HV power supply voltage output 105 are not greater than the HVD min threshold.

MVDFUNC_LVSUPPLY_Flag, MVDFUNC_HVSUPPLY_Flag, LVD_LVSUPPLY_flag, LVD_HVSUPPLY_flag, HVD_LVSUPPLY_Flag, HVD_HVSUPPLY_Flag, UVD_LVSUPPLY_Flag and UVD_HVSUPPLY_Flag all being high during the test mode entry condition results in the AND gate 116 outputting the set signal 121 as a logic high to the set input of the latch 122 and to the OR gate 118. Therefore, regardless of the state of the Monitor_Mask signal, the output 123 of the OR gate 118 will be a logic high during the test mode entry condition. Since test mode entry occurs after power on reset is released, the POR_LVSUPPLY_Flag and POR_HVSUPPLY_Flag will be at a logic high. Therefore, all inputs to the AND gate 120 will be at a logic high during test mode entry, and the reset signal 125 will therefore be produced at a logic high. Due to the bubble (inverter) at the reset input of the latch 122, this means that during test mode entry, the output from the latch 127 will be a logic high, thereby enabling the interface for all analog IPs in the electronic device 106.

In case of the test mode entry condition where not all the LV supplies and HV supplies are probed, i.e. considering the case of the NVM-Only test mode where supplies corresponding to other analog IPs like ADC, PLL, FLEXRAY, etc. need not be probed, the MVDFUNC_LVSUPPLY_Flag, MVDFUNC_HVSUPPLY_Flag, LVD_LVSUPPLY_flag, LVD_HVSUPPLY_flag, HVD_LVSUPPLY_Flag, HVD_HVSUPPLY_Flag, UVD_LVSUPPLY_Flag and UVD_HVSUPPLY_Flag will be logic high only for those LV supply and HV supply probed, keeping only those SR latch outputs 127 to high, i.e for NVM-Only test mode. MVDFUNC_LVSUPPLY_Flag, MVDFUNC_HVSUPPLY_Flag, LVD_LVSUPPLY_flag, LVD_HVSUPPLY_flag, HVD_LVSUPPLY_Flag, HVD_HVSUPPLY_Flag, UVD_LVSUPPLY_Flag and UVD_HVSUPPLY_Flag will be logic low for those LV supply and HV supplies not probed keeping those SR latch outputs 127 to low, i.e. for an ADC, PLL, FLEXRAY, etc.

As should be apparent from the above, there are multiple instances of the circuitry shown in the electronic device 106 of FIG. 2, with one instance for the nonvolatile memory and each analog IP.

When one of or all of MVDFUNC_LVSUPPLY_Flag, MVDFUNC_HVSUPPLY_Flag, LVD_LVSUPPLY_Flag, LVD_HVSUPPLY_Flag, HVD_LVSUPPLY_Flag, HVD_HVSUPPLY_Flag, UVD_LVSUPPLY_Flag and UVD_HVSUPPLY_Flag are low, but Monitor mask is equal to '1', this will force the SR latch 122 out of reset, however the SR latch output 127 will remain low as it is not set. In test mode entry where all LV supplies and HV supplies are probed, the SR latch output 127 will be high and all analog IP interfaces enabled, but in the case of test mode entry corresponding to the NVM-Only test mode, the SR latch output 127 corresponding to the nonvolatile memory and any other analog IPs will be high only if the corresponding LV and HV supplies of the nonvolatile memory and those analog IPs are probed. The SR latch output 127 corresponding to other analog IPs whose LV and HV supply not probed will remain at a logic low, i.e. the analog IP interfaces for nonvolatile memory and only those analog IPs whose LV and HV supply is probed are enabled, and the analog IP interfaces for those analog IPs whose LV and HV supply is not probed are disabled.

The MVDTEST_LVSUPPLY_Flag, MVDTEST_HVSUPPLY_Flag, POR_LVSUPPLY_Flag, POR_HVSUPPLY_FLAG (POR of both the LV and HV supply) will be logic high in both cases (test mode entry and NVM-Only test mode entry) as those LV and HV supplies are always probed.

Recall that in the digital testing mode condition, the HV power supply voltage output 105 and LV power supply voltage output 103 are set between the ultra high voltage detector maximum threshold, shown as UVD max threshold and the minimum voltage detector for functional minimum threshold, shown as MVD_FUNC min threshold.

Therefore, in the digital testing mode condition, the MVDTEST_LVSUPPLY_Flag and MVDTEST_HVSUPPLY_Flag will be at a logic high and the MVD_FUNC_LVSUPPLY_flag and MVD_FUNC_HVSUPPLY_Flag will be at a logic low because the LV power supply voltage output 103 and HV power supply voltage output 105 are not greater than the MVD_FUNC min threshold. The LVD_LVSUPPLY_Flag and LVD_HVSUPPLY_Flag will be at a logic low because the LV power supply voltage 103 and HV power supply voltage output 105 are not greater than the LVD min threshold. The HVD_LVSUPPLY_Flag, HVD_HVSUPPLY_Flag, UVD_LVSUPPLY_Flag and UVD_HVSUPPLY_Flag will be at a logic low because the LV power supply voltage 103 and HV power supply voltage output 105 are greater than UVD min threshold.

The MVDFUNC_LVSUPPLY_Flag, MVDFUNC_HVSUPPLY_Flag, LVD_LVSUPPLY_Flag, LVD_HVSUPPLY_Flag, HVD_LVSUPPLY_Flag, HVD_HVSUPPLY_Flag, UVD_LVSUPPLY_Flag and UVD_HVSUPPLY_Flag all being low during the digital testing mode condition results in the AND gate 116 outputting the set signal 121 as a logic low to the set input of the latch 122 and to the OR gate 118. The Monitor_Mask flag will remain high during test mode entry, NVM-Only test mode entry, digital test modes, and analog test modes. The POR_LVSUPPLY_Flag, POR_HVSUPPLY_Flag, MVDTEST_LVSUPPLY_Flag and MVDTEST_HVSUPPLY_Flag of both the LV and HV supply will remain high as both the LV and HV supply are greater than the maximum threshold.

Therefore, even if the SR latch 122 is not set during digital test modes (i.e. the set input of the latch 122 is logic low), its output 127 will remain high as it is not also in reset (i.e., the reset input of the latch 122 is at a logic low due to the bubble in the reset path) and the SR latch 122 was earlier set (i.e. the set input of the latch 122 is logic high) during test mode entry. Since during test mode entry all SR latch outputs 127 will remain high (as the set input of SR latch 122 is high and the reset input of SR latch 122 is low), they continue to remain high even during digital testing mode conditions as they hold their previous value from test mode entry. During digital test modes, all analog IPs are not in their functional range (between LVD max threshold and HVD min threshold) and are kept powered down. Note that during digital test mode, the analog IP interfaces are enabled but this is not an issue as the analog IPs are kept powered down, forcing their outputs to a reset state (i.e. remain at a static value).

Note that analog IP tests are performed using the same voltage stack of test mode entry (i.e. between HVD min threshold and LVD max threshold. Therefore, the interface for all analog IPs is enabled during test mode entry and analog IP testing where all the LV and HV supplies are probed, but in the case of test mode entry targeting the NVM-Only test mode, the interface of analog IPs whose LV and HV supplies are not probed is disabled during test mode entry and during NVM-Only analog IP testing. This is particularly advantageous because the interface of those analog IPs disabled whose LV and HV supplies are not probed avoids the additional power consumption on the digital LV domain.

Even when an analog IP's LV supply and HV supply are probed, it can only be counted on to operate correctly under conditions resulting in all of the LVD_LVSUPPLY_Flag, LVD_LVSUPPLY_Flag, HVD_LVSUPPLY_Flag and the HVD_HVSUPPLY_Flag being at a logic high. This is achieved by keeping the voltage stack for test mode entry and analog IP testing different from the voltage stack for digital IP testing. This is particularly advantageous to avoid the yield issues at power-up and during analog IP testing by testing in the correct voltage range or not over testing, but also testing digital IPs in their correct range or not under testing, by keeping analog IPs powered down (i.e analog IP interface enabled but output of the analog IPs in a reset state).

Figure 6:
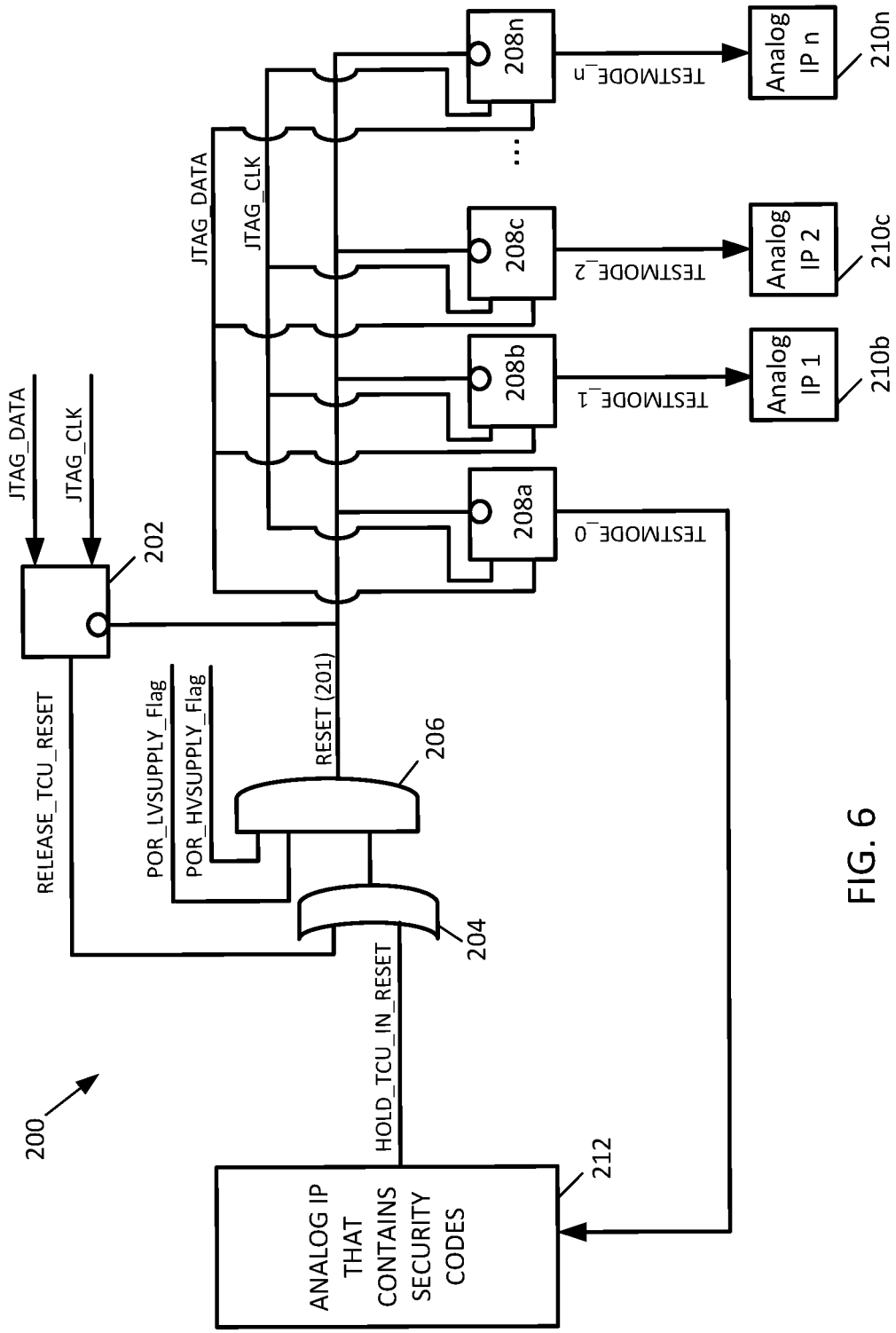
FIG. 6 is a diagram showing the test mode entry circuit of FIG. 2.

The importance of this will now be described with additional reference to FIG. 6 that shows a test mode entry circuit 200 within the electronic device 106 that controls entry of the electronic device 106 into testing mode. The test mode entry circuit 200 includes a flip-flop 202 receiving a JTAG_Data signal and being reset by an analog IP reset signal 201. The flip-flop 202 provides the RELEASE_TCU_RESET signal at its output, and is clocked by the JTAG_CLK signal.

OR gate 204 receives the HOLD_TCU_IN_RESET signal from analog IP 212 (which may be a non-volatile memory or one-time programmable memory) and receives the RELEASE_TCU_RESET from the flip-flop 202, performs a logical OR operation on those signals, and provides its output to AND gate 206.

The AND gate 206 receives output from the OR gate 204 as well as POR_LVSUPPLY_Flag and POR_HVSUPPLY_Flag, performs a logical AND operation on those signals, and generates the analog IP reset signal 201 as its output. The analog IP reset signal 201 resets not only the flip-flop 202, but also the flip-flop 208a . . . 208n.

The flip-flop 208a provides its output as the TESTMODE_0 signal to the analog IP 212, while flip-flops 208b . . . 208n provide their respective outputs as the TESTMODE_1 . . . TESTMODE_n signals to analog intellectual property packages (IPs) 210b . . . 210n.

Operation of the test mode entry circuit 200 is now described. At power-up, the electronic device 106 resets with the POR_LVSUPPLY_Flag and POR_HVSUPPLY_Flag being low, the HOLD_TCU_IN_RESET signal being set low by the analog IP 212, and the RELEASE_TCU_RESET signal being set low by the flip-flop 202. After the POR of the LV supply and HV supply is released, POR_LVSUPPLY_Flag and POR_HVSUPPLY_Flag will become high, and if security codes stored in the analog IP 212 are not correctly read, then the HOLD_TCU_IN RESET signal will remain low, and test mode cannot be entered.

If the security codes stored in the analog IP 212 are correctly read, the analog IP 212 sets the HOLD_TCU_IN_RESET signal high. Once HOLD_TCU_IN_RESET is high, the OR gate 204 will output a logic high, which combined with POR_LVSUPPLY_Flag and POR_HVSUPPLY_Flag being high, will cause the analog IP reset signal 201 to rise, releasing the reset for flip-flops 202 and 208a . . . 208n (which have an active low reset). Next, a logic high bit is received via the JTAG data line that, when passed by the flip-flop 202 upon the JTAG clock rising, masks the value of HOLD_TCU_IN_RESET so that the electronic device 106 is not placed back into reset by HOLD_T-CU_IN_ RESET going low. Test mode has now been properly entered.

The issue that the electronic device 106 seeks to avoid is enabling of the analog IPs 210b . . . 210n and 212 outside of their correct operating region, which is between the low voltage detector max threshold and the high voltage detector min threshold. This may happen using the prior art voltage stack (see FIG. 3) during test mode entry, as the prior art voltage stack extends from the minimum voltage detector for functional minimum threshold to the ultra-high voltage detector max threshold during both test entry mode and testing mode (see FIG. 3). The result could be, for example, that the analog IP 212 fails to set the HOLD_TCU_IN_RE-SET signal high, and thus, any testing mode (digital or analog) is never entered into during test entry mode. By using a separate voltage stack during test mode entry, with such voltage stack being between the low voltage detector max threshold and the high voltage detector min threshold, this issue is avoided, and the yield losses that would occur from failure to enter test mode are avoided.

Therefore, one benefit of this electronic device 106 as described herein is to avoid improper failure to enter test mode. Another benefit is that of reduced power consumption on the digital LV supply domain by disabling the analog IP interface whose LV and HV suppies arey not probed. Still another benefit is cost savings, as the additional parts used in prior art designs to disable analog IP interfaces whose LV and HV supplies not probed often require additional probes, as well as area and components. An even further benefit is quicker power up time due to the elimination of the repeated reset that may occur due to any voltage drop during supply ramp up at device boot (i.e. the SR latch takes care that there is a margin between set and reset).

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An electronic device for use with a test apparatus, the electronic device comprising:
a power management circuit configured to generate output for a plurality of voltage monitors that each detect whether voltages received from the test apparatus are at least a different minimum threshold;
wherein the power management circuit is also configured to generate a test enable signal indicative of whether the electronic device is receiving the voltages supplied from the test apparatus;
a control circuit receiving the output for the plurality of voltage monitors and the test enable signal and configured to generate at least one control signal as a function of the output for the plurality of voltage monitors and the test enable signal; and
an output circuit receiving the at least one control signal and configured to generate an interface control signal that selectively enables or disables interface with analog intellectual properties (IPs) within the electronic device in response to the at least one control signal.

2. The electronic device of claim 1, wherein the voltages received from the test apparatus are an upper voltage and a lower voltage; and wherein each of the plurality of voltage monitors receives input from either the upper voltage or the lower voltage and indicates whether the received upper voltage or received lower voltage is at least a different maximum threshold.

3. The electronic device of claim 2, wherein the at least one control signal comprises a set signal and a reset signal; and wherein the output circuit comprises a latch having a set input receiving the set signal and a reset input receiving the reset signal.

4. The electronic device of claim 3, wherein the control circuit comprises:
a first AND gate receiving the output for each of the plurality of voltage monitors and configured to assert the set signal if each of the plurality of voltage monitors indicates that its received upper voltage or received lower voltage is at least its different maximum threshold; and
a logic circuit receiving the set signal and configured to assert the reset signal as a function of the set signal and the test enable signal.

5. The electronic device of claim 4, wherein the power management circuit is also configured to generate a monitor mask signal that when asserted indicates whether the set signal is to be masked; and wherein the logic circuit asserts the reset signal as a function of the set signal, the test enable signal, and the monitor mask signal.

6. The electronic device of claim 5, wherein the logic circuit comprises:
an OR gate receiving the set signal and the monitor mask signal; and
a second AND gate receiving output from the OR gate and the test enable signal, the second AND gate configured to generate the reset signal as a function of the output from the OR gate and the test enable signal.

7. The electronic device of claim 6, wherein the test enable signal comprises a power on reset signal and a minimum voltage detector testing signal.

8. An electronic device for use with a test apparatus, the electronic device comprising:
a power management circuit configured to generate output for a plurality of voltage monitors that determine a range for first and second supply voltages received by the electronic device from the test apparatus;
a control circuit receiving the output for the plurality of voltage monitors and configured to generate at least one control signal as a function of the output for the plurality of voltage monitors; and
an output circuit receiving the at least one control signal and configured to generate an interface control signal that selectively enables or disables interface of the test apparatus with analog intellectual properties (IPs) within the electronic device in response to the at least one control signal.

9. The electronic device of claim 8, wherein the interface control signal enables interface of all analog IPs within the electronic device as a function of the at least one control signal indicating that all analog IPs are currently coupled to the first and second supply voltages; and wherein the interface control signal disables or enables interface of ones of the analog IPs based on whether they are currently coupled to the first and second supply voltages.

10. The electronic device of claim 8, wherein the first and second supply voltages are selectively coupled to a first voltage stack for test mode entry, nonvolatile memory testing and testing of analog IPs, and to a second voltage stack for digital test mode.

11. The electronic device of claim 10, wherein an upper end of the first voltage stack is less than an upper end of the second voltage stack, and wherein a lower end of the first voltage stack is higher than a lower end of the second voltage stack.

12. The electronic device of claim 8, wherein each of the plurality of voltage monitors receives input from either the first supply voltage or the second supply voltage and indicates whether the received first supply voltage or received second voltage is at least a different maximum threshold.

13. The electronic device of claim 12, wherein the at least one control signal comprises a set signal and a reset signal; and wherein the output circuit comprises a latch having a set input receiving the set signal and a reset input receiving the reset signal.

14. The electronic device of claim 13, wherein the power management circuit is also configured to generate a test enable signal indicative of whether the electronic device is receiving a minimum required voltage for each of the first and second supply voltages from the test apparatus; and wherein the control circuit comprises:
 a first AND gate receiving the output for each of the plurality of voltage monitors and configured to assert the set signal if each of the plurality of voltage monitors indicates that its received first supply voltage or received second supply voltage is at least its different maximum threshold; and
 a logic circuit receiving the set signal and configured to assert the reset signal as a function of the set signal and the test enable signal.

15. The electronic device of claim 14, wherein the power management circuit is also configured to generate a monitor mask signal that when asserted indicates whether the set signal is to be masked; and wherein the logic circuit asserts the reset signal as a function of the set signal, the test enable signal, and the monitor mask signal.

16. The electronic device of claim 15, wherein the logic circuit comprises:
 an OR gate receiving the set signal and the monitor mask signal; and
 a second AND gate receiving output from the OR gate and the test enable signal, the second AND gate configured to generate the reset signal as a function of the output from the OR gate and the test enable signal.

17. An electronic device for use with a test apparatus that is switchable between first and second power supply stacks, the electronic device comprising:
 a power management circuit configured to generate output for the first and second power supply stacks based on the first and second power supply stacks being applied to the electronic device from the test apparatus;
 wherein the power management circuit is also configured to generate a test enable signal indicative of whether at least one of the first and second power supply stacks is coupled to the electronic device;
 a control circuit receiving the output for the first and second power supply stacks and the test enable signal and configured to generate at least one control signal as a function of the output for the first and second power supply stacks and the test enable signal; and
 an output circuit receiving the at least one control signal and configured to generate an interface control signal that selectively enables or disables interface of the test apparatus with analog intellectual properties (IPs) within the electronic device in response to the at least one control signal.

18. The electronic device of claim 17, wherein the at least one control signal comprises a set signal and a reset signal; and wherein the output circuit comprises a latch having a set input receiving the set signal and a reset input receiving the reset signal.

19. The electronic device of claim 18, wherein the power management circuit is also configured to generate a monitor mask signal that is asserted when the second power supply stack applied from test apparatus and indicates masking of the set signal.

20. The electronic device of claim 19, wherein the control circuit comprises:
 a first AND gate receiving the output for the first and second power supply stacks and configured to assert the set signal if the first power supply stack is connected to the electronic device;
 an OR gate receiving the set signal and the monitor mask signal; and
 a second AND gate receiving output from the OR gate and the test enable signal, the second AND gate configured to deassert the reset signal if one of the first and second power supply stack is coupled to the electronic device and assert the reset signal if one of the first and second power supply stack is not connected to the electronic device.

21. The electronic device of claim 20, wherein the test enable signal comprises a power on reset signal and a minimum voltage detector test signal corresponding to both a low voltage supply and a high voltage supply.

* * * * *